(12) United States Patent
Peng

(10) Patent No.: US 9,653,607 B2
(45) Date of Patent: May 16, 2017

(54) THIN FILM TRANSISTOR AND MANUFACTURING METHOD THEREOF

(71) Applicant: Century Technology (Shenzhen) Corporation Limited, Shenzhen (CN)

(72) Inventor: Yu-Ching Peng, New Taipei (TW)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 0 days.

(21) Appl. No.: 14/718,951

(22) Filed: May 21, 2015

(65) Prior Publication Data
US 2016/0293770 A1    Oct. 6, 2016

(30) Foreign Application Priority Data
Mar. 30, 2015   (CN) .......................... 2015 1 0143210

(51) Int. Cl.
| | | |
|---|---|---|
| *H01L 29/10* | (2006.01) | |
| *H01L 29/786* | (2006.01) | |
| *H01L 29/08* | (2006.01) | |
| *H01L 29/417* | (2006.01) | |
| *H01L 29/66* | (2006.01) | |
| *H01L 21/265* | (2006.01) | |
| *H01L 21/16* | (2006.01) | |
| *H01L 29/45* | (2006.01) | |

(52) U.S. Cl.
CPC .. *H01L 29/78621* (2013.01); *H01L 21/26513* (2013.01); *H01L 29/0847* (2013.01); *H01L 29/41733* (2013.01); *H01L 29/66757* (2013.01); *H01L 21/16* (2013.01); *H01L 29/458* (2013.01); *H01L 29/7869* (2013.01)

(58) Field of Classification Search
CPC ........... H01L 29/78621; H01L 29/7869; H01L 29/458; H01L 29/0847; H01L 29/66757; H01L 29/41733; H01L 21/16
See application file for complete search history.

(56) References Cited

U.S. PATENT DOCUMENTS

| | | | | |
|---|---|---|---|---|
| 6,066,508 A | * | 5/2000 | Tanabe ............... | B01D 53/8671 257/E21.66 |
| 6,850,000 B1 | * | 2/2005 | Huang ................ | H01L 27/3248 313/500 |
| 2005/0090045 A1 | * | 4/2005 | Chang ................ | H01L 27/1214 438/151 |
| 2005/0272186 A1 | * | 12/2005 | Chu .................. | H01L 29/42384 438/151 |
| 2005/0287722 A1 | * | 12/2005 | Zhang ............... | H01L 21/31111 438/149 |

FOREIGN PATENT DOCUMENTS

TW       200926413     6/2009

* cited by examiner

*Primary Examiner* — Su C Kim
(74) *Attorney, Agent, or Firm* — Steven Reiss

(57) ABSTRACT

A thin film transistor (TFT) includes a semiconductive layer, a first inter-layer drain (ILD) layer, a second ILD layer, and at least one contact hole passing through the first ILD layer and the second ILD layer. The semiconductive layer includes a channel region, a first lightly doped drain (LDD) region, a second LDD region, a first heavily doped drain (HDD) region, and a second HDD region. The at least one contact hole includes a first portion passing through the second ILD layer and a second portion passing through the first ILD layer. The second portion gradually narrows along a direction from a top to a bottom of the first ILD layer.

17 Claims, 18 Drawing Sheets

THIN FILM TRANSISTOR AND MANUFACTURING METHOD THEREOF

CROSS-REFERENCE TO RELATED APPLICATIONS

This application claims priority to Chinese Patent Application No. 201510143210.0 filed on Mar. 30, 2015, the contents of which are incorporated by reference herein.

FIELD

The subject matter herein generally relates to a thin film transistor (TFT) and a manufacturing method of the TFT.

BACKGROUND

Thin film transistors (TFTs) are widely used in electronic devices, such as a liquid crystal display (LCD), to serve as a switch component. Generally, a TFT can include a gate, a source, a drain, and a channel layer coupling the source to the drain. The channel layer can be made of amorphous silicon (a-Si), low temperature poly-silicon, LTPS), metal oxides, or other like materials. The TFTs having a lightly doped drain (LDD) structure are widely used because they have the advantage of reducing leakage current.

BRIEF DESCRIPTION OF THE DRAWINGS

Implementations of the present technology will now be described, by way of example only, with reference to the attached figures.

DETAILED DESCRIPTION

Figure 1:
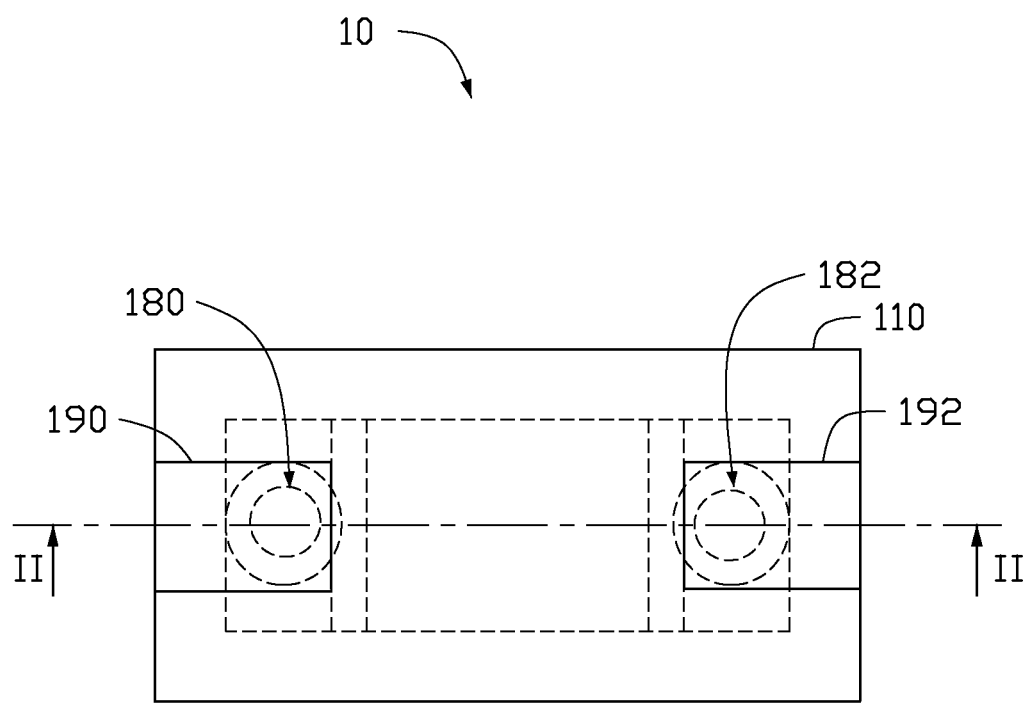
FIG. 1 is a diagrammatic view of a thin film transistor (TFT) according to a first embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "coupled" is defined as connected, whether directly or indirectly through intervening components, and is not necessarily limited to physical connections. The connection can be such that the objects are permanently connected or releasably connected. The term "comprising", when utilized, means "including, but not necessarily limited to"; it specifically indicates open-ended inclusion or membership in the so-described combination, group, series and the like.

The present disclosure is described in relation to a thin film transistor (TFT) and a manufacturing method of the TFT.

Figure 2:
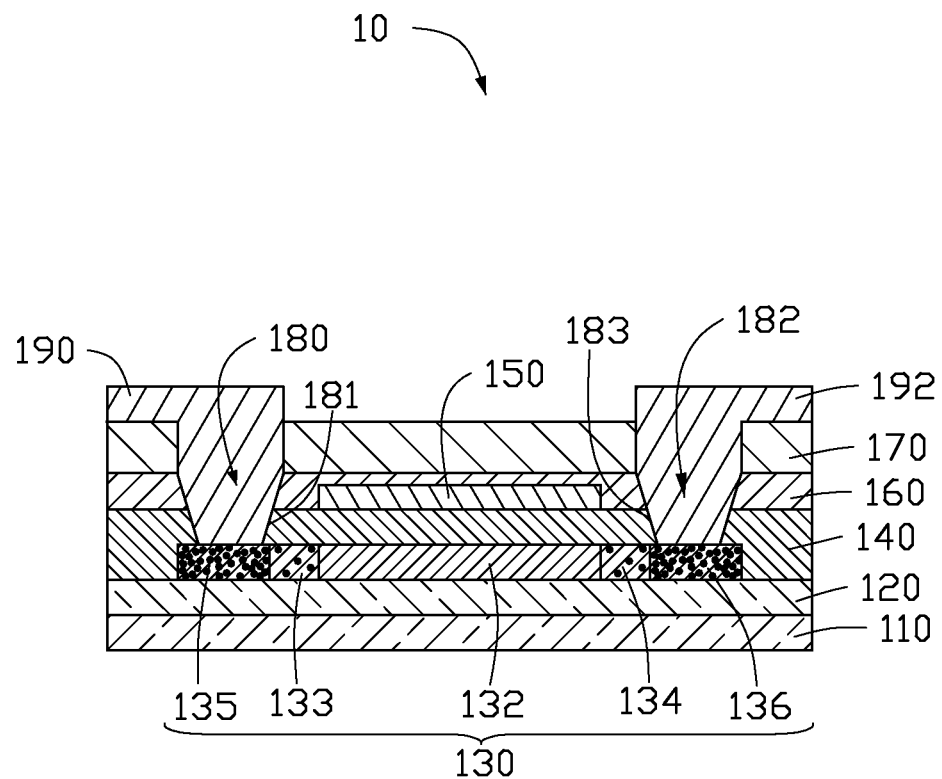
FIG. 2 is a cross-sectional view of the TFT of FIG. 1 taken along line II-II.

Referring to FIG. 1 and FIG. 2, FIG. 1 is a diagrammatic view of a thin film transistor (TFT) 10 according to a first embodiment. FIG. 2 is a cross-sectional view of the TFT 10 of FIG. 1 taken along line II-II. The TFT 10 can be a P-channel TFT or an N-channel TFT. In this embodiment, the TFT 10 is an N-channel top gate type TFT.

The TFT 10 includes a substrate 110, a buffer layer 120, a semiconductive layer 130, a gate insulation layer 140, a gate 150, a first inter-layer dielectric (ILD) layer 160, a second ILD layer 170, a source 190, and a drain 192. The buffer layer 120 is located on the substrate 110 and covers the substrate 110. The semiconductive layer 130 is located on the buffer layer 120. The gate insulation layer 140 is located on the semiconductive layer 130 and covers the semiconductive layer 130. The gate 150 is located on the gate insulation layer 140 to correspond with the semiconductive layer 130. The first ILD layer 160 is located on the gate 150 and covers the gate 150 and a portion of the gate insulation layer 140. The second ILD layer 170 is located on the first ILD layer 160 and covers the first ILD layer 160. A first contact hole 180 and a second contact hole 182 pass through the gate insulation layer 140, the first ILD layer 160 and the second ILD layer 170 being respectively defined at opposite sides of the semiconductive layer 130 to expose two opposite ends of the semiconductive layer 130. The source 190 and the drain 192 are respectively coupled to opposite ends of the semiconductive layer 130 via the first contact hole 180 and the second contact hole 182.

Each of the first contact hole 180 and the second contact hole 182 includes a first portion passing through the second ILD layer 170 and a second portion passing through the gate insulation layer 140 and the first ILD layer 160 The second portion gradually narrows along a direction from a top to a bottom of the first ILD layer 160. The top of the first ILD layer 160 is adjacent to the second ILD layer 170, and the bottom of the first ILD layer 160 is away from the second ILD layer 170. The second portion of the first contact hole 180 is substantially trapezoidal and has two opposite inclined sidewalls 181. The second portion of the second contact hole 182 is substantially trapezoidal and has two opposite inclined sidewalls 183. The first portion of the first and second through holes 180, 182 is substantially rectangular. The source 190 and the drain 192 are respectively filled into the first contact hole 180 and the second contact hole 182 to make contact with the semiconductive layer 130.

In at least one embodiment, the substrate 110 can be a glass substrate or a quartz substrate. The gate 150, the source 190, and the drain 192 can be made of metal materials or metal alloy materials. The gate insulation layer 140 can be made of silicon nitride (SiNx), silicon oxide (SiOx), or other like materials. The first ILD layer 160 can be made of oxide materials, while the second ILD layer 170 can be made of nitride materials. An etching rate of the first ILD layer 160 is different from that of the second ILD layer 170.

The semiconductive layer 130 includes poly-silicon materials. The semiconductive layer 130 can include a channel region 132, a first lightly doped drain (LDD) region 133, a second LDD region 134, a first heavily doped drain (HDD) region 135, and a second HDD region 136. The first LDD region 133 and the second LDD region 134 are respectively located at opposite sides of the channel region 132. The first HDD region 135 is located at a side of the first LDD region 133 away from the channel region 132, and the second HDD region 136 is located at a side of the second LDD region 134 away from the channel region 132. The first HDD region 135 is exposed from the first contact hole 180, thereby coupling to the source 190. The second HDD region 136 is exposed from the second contact hole 182, thereby coupling to the drain 192.

Figure 7:
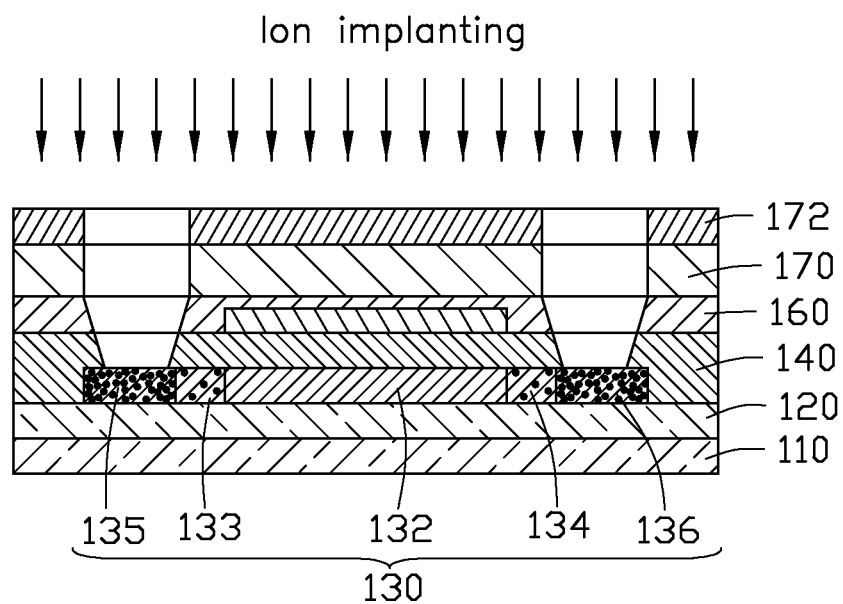
FIG. 7 illustrates an ion implanting process performed to implant ions into a portion of the semiconductive layer.
Figure 8:
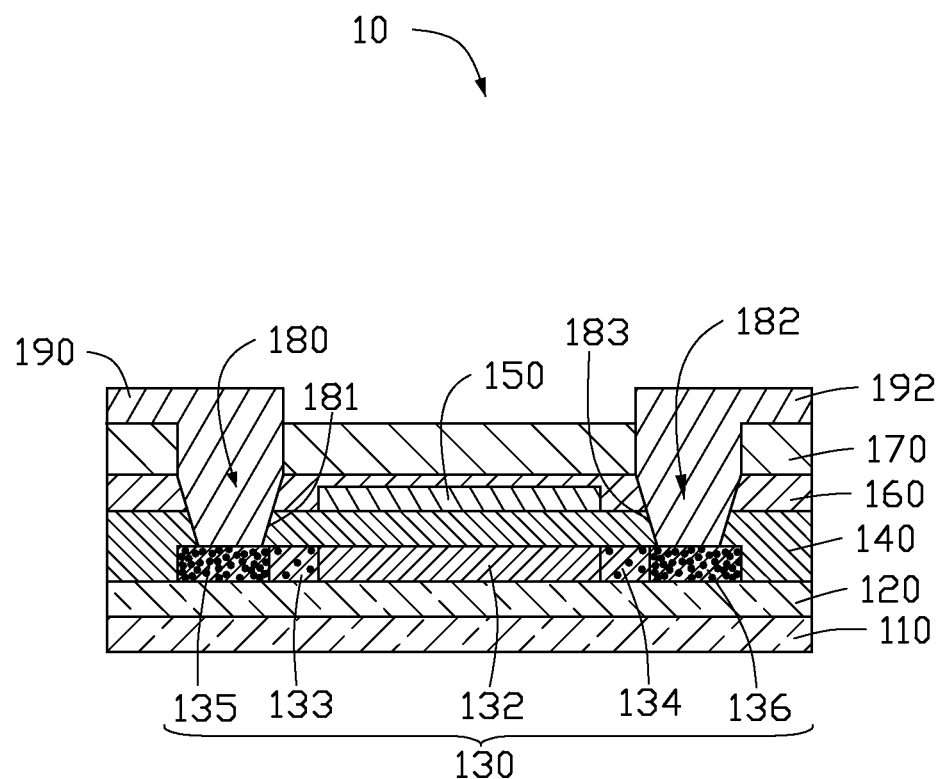
FIG. 8 illustrates the photoresist layer removed from the second ILD layer and a source and a drain are formed to couple with the semiconductive layer.
Figure 9:
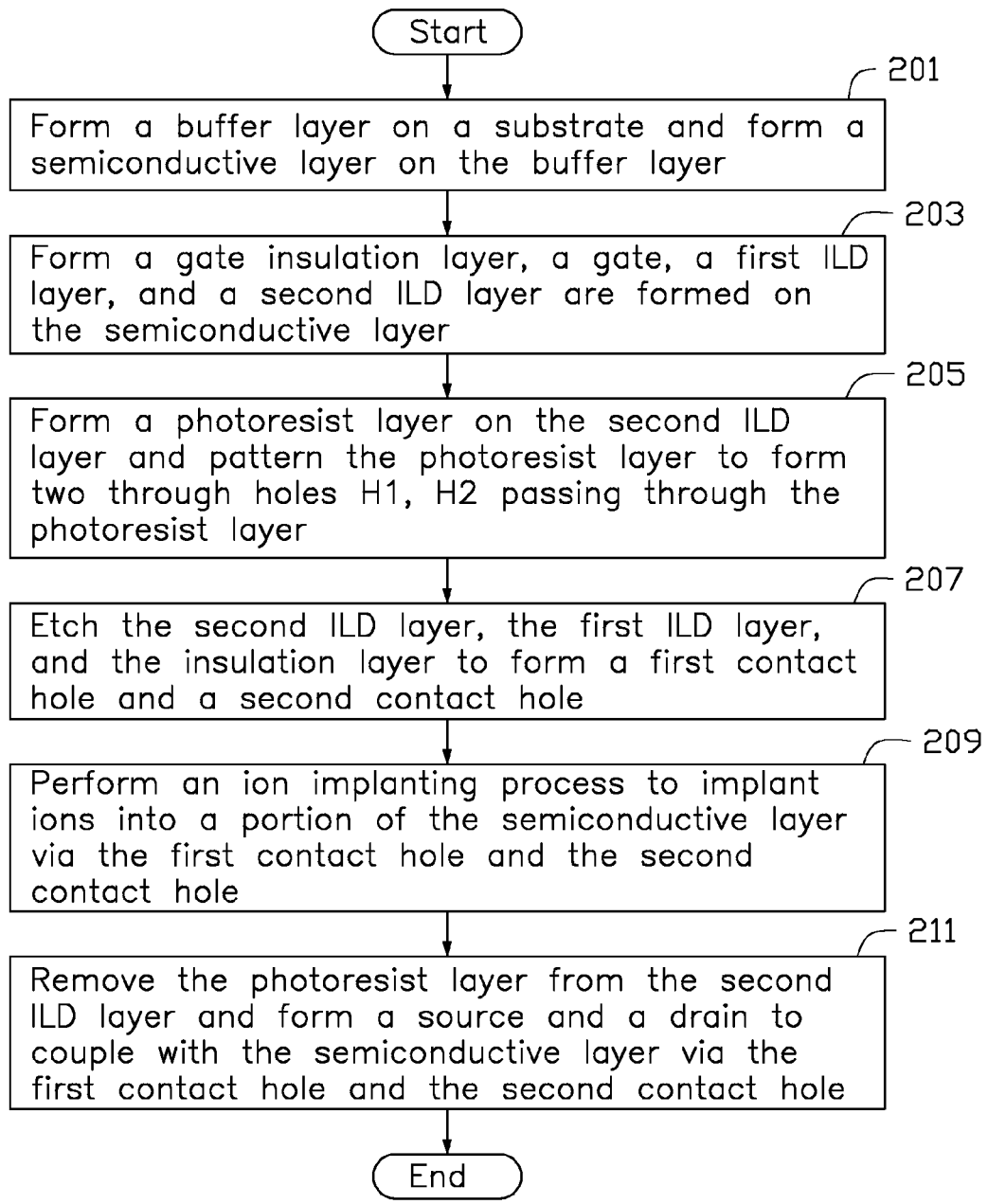
FIG. 9 is a flowchart of a method for manufacturing the TFT.

Referring to FIG. 3 to FIG. 9, FIG. 3 to FIG. 8 illustrate each process for manufacturing the TFT 10. FIG. 9 illustrates a flowchart of a method for manufacturing the TFT 10. The method is provided by way of example, as there are a variety of ways to carry out the method. Each block shown in FIG. 9 represents one or more processes, methods, or subroutines which are carried out in the example method. Furthermore, the order of blocks is illustrative only and the order of the blocks can change. Additional blocks can be added or fewer blocks may be utilized without departing from the scope of this disclosure. The example method can begin at block 201.

Figure 3:
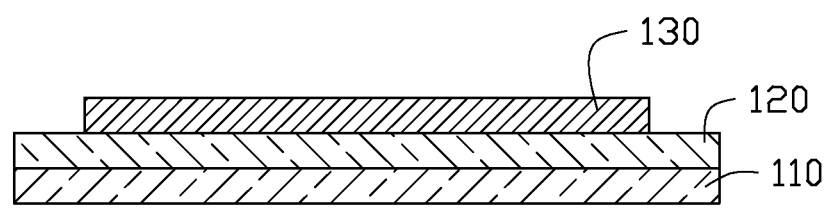
FIG. 3 illustrates a buffer layer and a semiconductive layer formed on a substrate in a manufacturing process of the TFT.

At block 201, referring to FIG. 3, a buffer layer 120 is formed on a substrate 10 and a semiconductive layer 130 is formed on the buffer layer 120.

In at least one embodiment, the semiconductive layer 130 can be a poly-silicon material layer. In one example, a layer of amorphous silicon (a-Si) materials is first coated on the buffer layer 120. Then, the a-Si materials are annealed by an excimer laser annealing (ELA) process to form the semiconductive layer 130.

Figure 4:
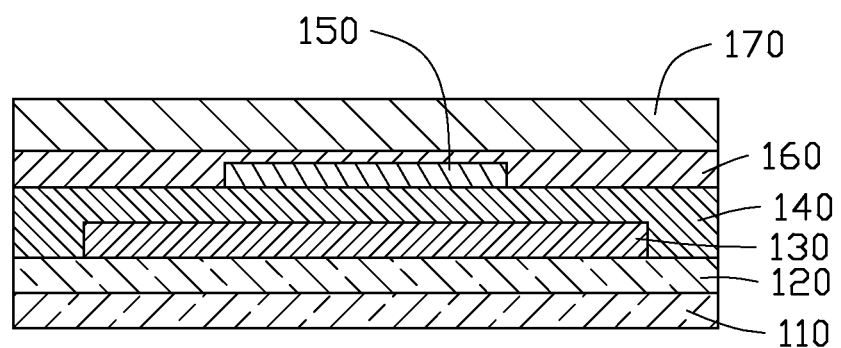
FIG. 4 illustrates a gate insulation layer, a gate, a first inter-layer dielectric (ILD) layer, and a second ILD layer respectively formed on the semiconductive layer of FIG. 3.

At block 203, referring to FIG. 4, a gate insulation layer 140, a gate 150, a first ILD layer 160, and a second ILD layer 170 are formed on the semiconductive layer 130 in that order. In at least one embodiment, a layer of insulation materials is coated on the semiconductive layer 130 to form the gate insulation layer 140. Then, a layer of conductive material (such as metal) is formed on the gate insulation layer 140 and the layer of conductive material is patterned to form the gate 150 on the gate insulation layer 140. Finally, a first layer of dielectric materials is coated on the gate 150 and the gate insulation layer 140 to form the first ILD layer 160 and a second layer of dielectric materials is coated on the first ILD layer 160 to form the second ILD layer 170.

Figure 5:
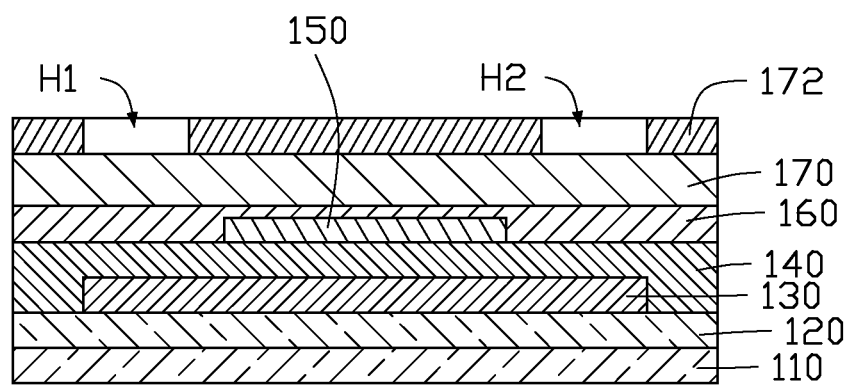
FIG. 5 illustrates a photoresist layer having two through holes formed on the second ILD layer of FIG. 4.

At block 205, referring to FIG. 5, a photoresist layer 172 is formed on the second ILD layer 170 and the photoresist layer 172 is patterned by a lithographic process to form two through holes H1, H2, passing through the photoresist layer 172.

Figure 6:
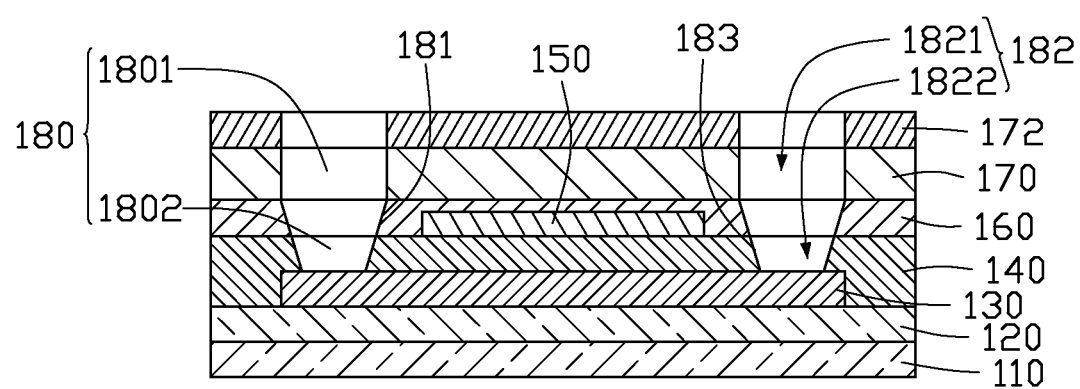
FIG. 6 illustrates a first contact hole and a second contact hole passing through the second ILD layer, the first ILD layer and the insulation layer being formed by an etching process.

At block 207, referring to FIG. 6, the second ILD layer 170, the first ILD layer 160, and the insulation layer 140 are etched in an etching process to form a first contact hole 180 and a second contact hole 182 under the two through holes H1 and H2.

In at least one embodiment, the first contact hole 180 includes a first portion 1801 passing through the second IDL layer 170 and a second portion 1802 passing through the first IDL layer 160 and the gate insulation layer 140. The second contact hole 182 includes a first portion 1821 passing through he second IDL layer 170 and a second portion 1822 passing through the first IDL layer 160 and the gate insulation layer 140. A cross-sectional view of the second portion 1802 of the first contact hole 180 is substantially trapezoidal and has two oppositely inclined sidewalls 181. A cross-sectional view of the second portion 1822 of the second contact hole 182 shows it is substantially trapezoidal and has two oppositely inclined sidewalls 183. A cross-sectional view of the first portion 1801 of the first contact hole 180 and the first portion 1821 of the second contact hole 182 shows it is substantially rectangular. The first contact hole 180 and the second contact hole 182 can be formed using a plasma etching process, a reactive ion etching processing, or other like etching process.

At block 209, referring to FIG. 7, an ion implanting process is performed to implant ions into a portion of the semiconductive layer 130 via the first contact hole 180 and the second contact hole 182.

In this embodiment, when the ions are implanted into the semiconductive layer 130, the semiconductive layer 130 includes a channel region 132, a first lightly doped drain (LDD) region 133, a second LDD region 134, a first heavily doped drain (HDD) region 135, and a second HDD region 136. The channel region 130 does not include implanted ions. The first LDD region 133 and the second LDD region 134 are respectively located at opposite sides of the channel region 132. The first HDD region 135 is located at a side of the first LDD region 133 away from the channel region 132, and the second HDD region 136 is located at a side of the second LDD region 134 away from the channel region 132. Each of the first LDD region 133 and the second LDD region 134 is an N⁻ doped region, and each of the first HDD region 135 and the second HDD region 136 is an N⁺ doped region, because the TFT 10 is an N-channel top gate type TFT. A doped concentration of the first LDD region 133 and the second LDD region 134 is in a range about from $10^{12}$ atom/cm² to $10^{14}$ atom/cm². A doped concentration of the first HDD region 135 and the second HDD region 136 is in a range about from $10^{14}$ atom/cm² to $10^{16}$ atom/cm². A projected area of the first portion 1801 of the first contact hole 180 projected on the substrate 110 is greater than an area of the first HDD region 135 but is less than a sum of the area of the first HDD region 135 and an area of the first LDD region 133. Accordingly, a projected area of the first portion 1821 of the second contact hole 182 projected on the substrate 110 is greater than an area of the second HDD region 136 but is less than a sum of the area of the second HDD region 136 and an area of the second LDD region 134.

In other embodiment, each of the first LDD region 133 and the second LDD region 134 is a P− doped region, and each of the first HDD region 135 and the second HDD region 136 is a P+ doped region, when the TFT 10 is a P-channel type TFT.

At block 211, referring to FIG. 8, the photoresist layer 172 is removed from the second ILD layer 170 and a source 190 and a drain 192 are formed to couple with the semiconductive layer 130. In this embodiment, the source 190 and the drain 192 can be formed by conductive materials which are filled into the first contact hole 180 and the second contact hole 182.

Figure 10:
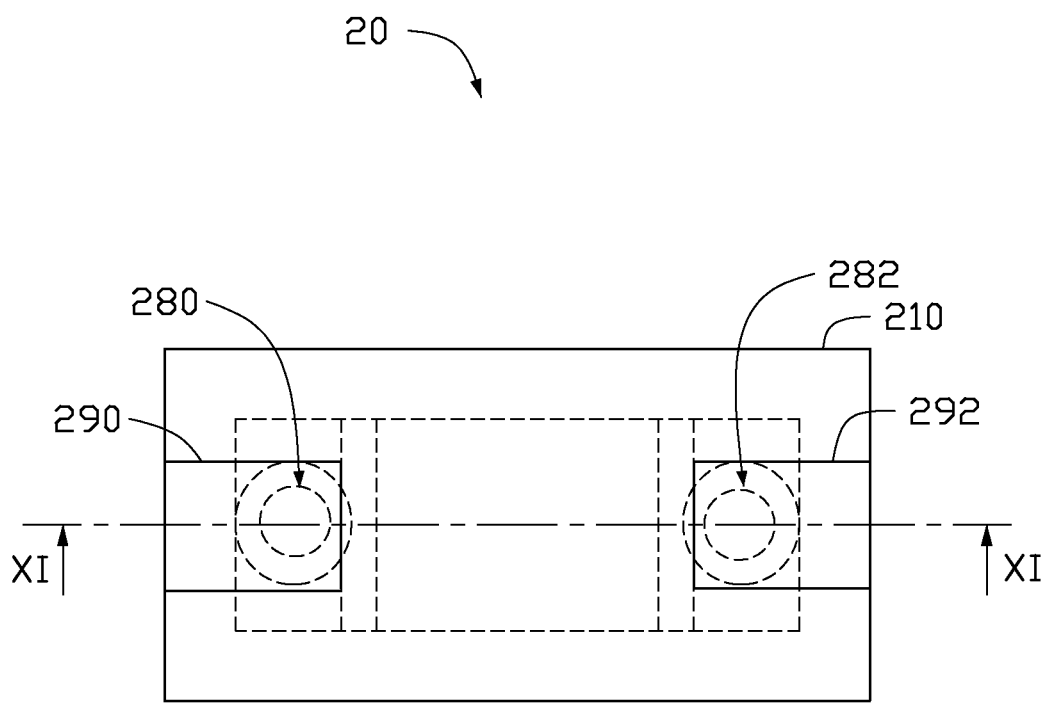
FIG. 10 is a diagrammatic view of a thin film transistor (TFT) according to a second embodiment.
Figure 11:
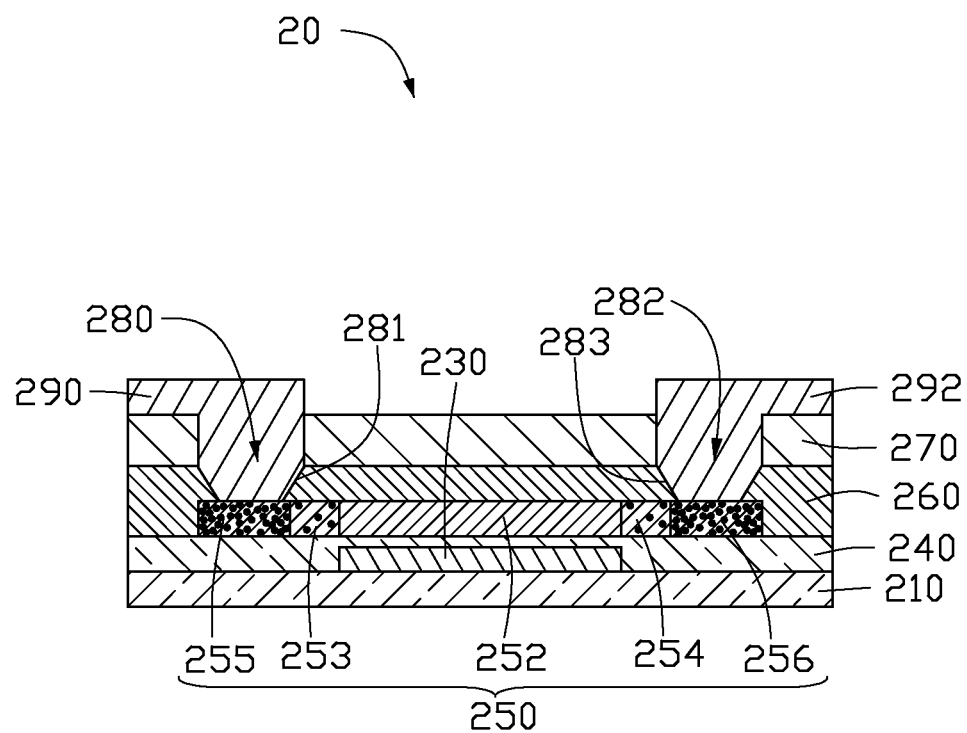
FIG. 11 is a cross-sectional view of the TFT of FIG. 9 taken along line X-X.

Referring to FIG. 10 and FIG. 11, FIG. 10 is a diagrammatic view of a thin film transistor (TFT) 20 according to a second embodiment. FIG. 11 is a cross-sectional view of the TFT 20 of FIG. 10 taken along line XI-XI. The TFT 20 can be a P-channel TFT or an N-channel TFT. In this embodiment, the TFT 20 is an N-channel top gate type TFT.

The TFT 20 includes a substrate 210, a gate 230, a gate insulation layer 240, a semiconductive layer 250, a first inter-layer dielectric (ILD) layer 260, a second ILD layer 270, a source 290, and a drain 292. The gate 230 is located on the substrate 210. The gate insulation layer 240 is located on the gate 230 and the substrate 210 and covers gate 230 and the substrate 210. The semiconductive layer 250 is located on the gate insulation layer 240. The first ILD layer 260 is located on the semiconductive layer 250 and covers the semiconductive layer 250 and a portion of the gate insulation layer 240. The second ILD layer 270 is located on the first ILD layer 260 and covers the first ILD layer 260. A first contact hole 280 and a second contact hole 282 passing through the first ILD layer 260 and the second ILD layer 270 are respectively defined at opposite sides of the semiconductive layer 250 to expose opposite ends of the semiconductive layer 250. The source 290 and the drain 292 are respectively coupled to opposite ends of the semiconductive layer 250 via the first contact hole 280 and the second contact hole 282.

Each of the first contact hole 280 and the second contact hole 282 includes a first portion passing through the second ILD layer 270 and a second portion passing through the first ILD layer 260 The second portion gradually narrows along a direction from a top to a bottom of the first ILD layer 260. The top of the first ILD layer 260 is adjacent to the second ILD layer 270 and the bottom of the first ILD layer 260 is away from the second ILD layer 270. A cross-sectional view of the second portion of the first contact hole 280 shows it is substantially trapezoidal and has two oppositely inclined sidewalls 281. A cross-sectional view of the second portion of the second contact hole 282 shows it is substantially trapezoidal and has two oppositely inclined sidewalls 283. A cross-sectional view of the first portion of the first and second through holes 280, 282 shows it is substantially rectangular. That is, the first portion is substantially cuboid-shaped. The source 290 and the drain 292 are respectively filled into the first contact hole 280 and the second contact hole 282 to make contact with the semiconductive layer 250.

In at least one embodiment, the substrate 210 can be a glass substrate or a quartz substrate. The gate 230, the source 290, and the drain 292 can be made of metal materials or metal alloy materials. The gate insulation layer 240 can be made of silicon nitride (SiNx), silicon oxide (SiOx), or other like materials. The first ILD layer 260 can be made of oxide materials, while the second ILD layer 270 can be made of nitride materials. An etching rate of the first ILD layer 260 is different from that of the second ILD layer 270.

The semiconductive layer 250 includes poly-silicon materials. The semiconductive layer 250 can include a channel region 252, a first lightly doped drain (LDD) region 253, a second LDD region 254, a first heavily doped drain (HDD) region 255, and a second HDD region 256. The first LDD region 253 and the second LDD region 254 are respectively located at opposite sides of the channel region 252. The first HDD region 255 is located at a side of the first LDD region 253 away from the channel region 252, and the second HDD region 256 is located at a side of the second LDD region 254 away from the channel region 252. The first HDD region 255 is exposed from the first contact hole 280 thereby coupling to the source 290. The second HDD region 256 is exposed from the second contact hole 282 thereby coupling to the drain 292.

Figure 16:
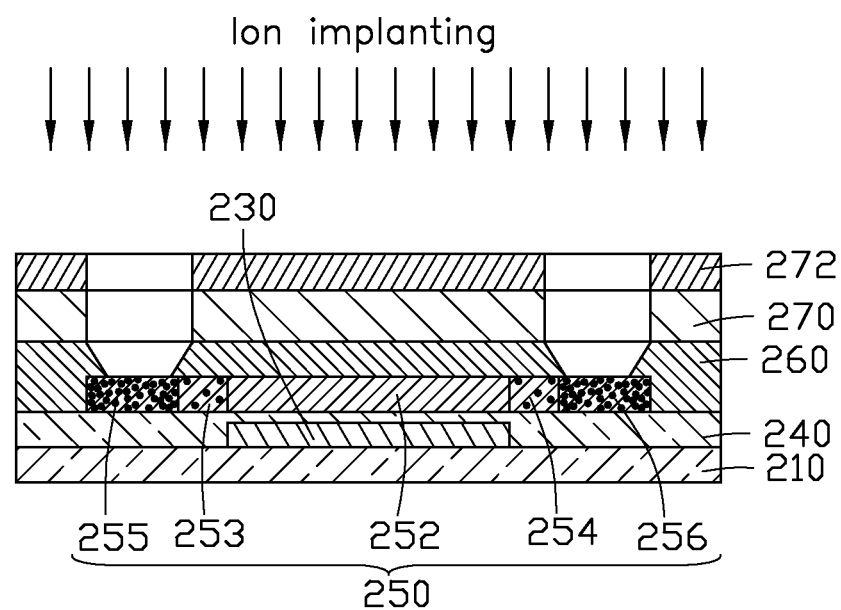
FIG. 16 illustrates an ion implanting process performed to implant ions into a portion of the semiconductive layer of FIG. 15.
Figure 17:
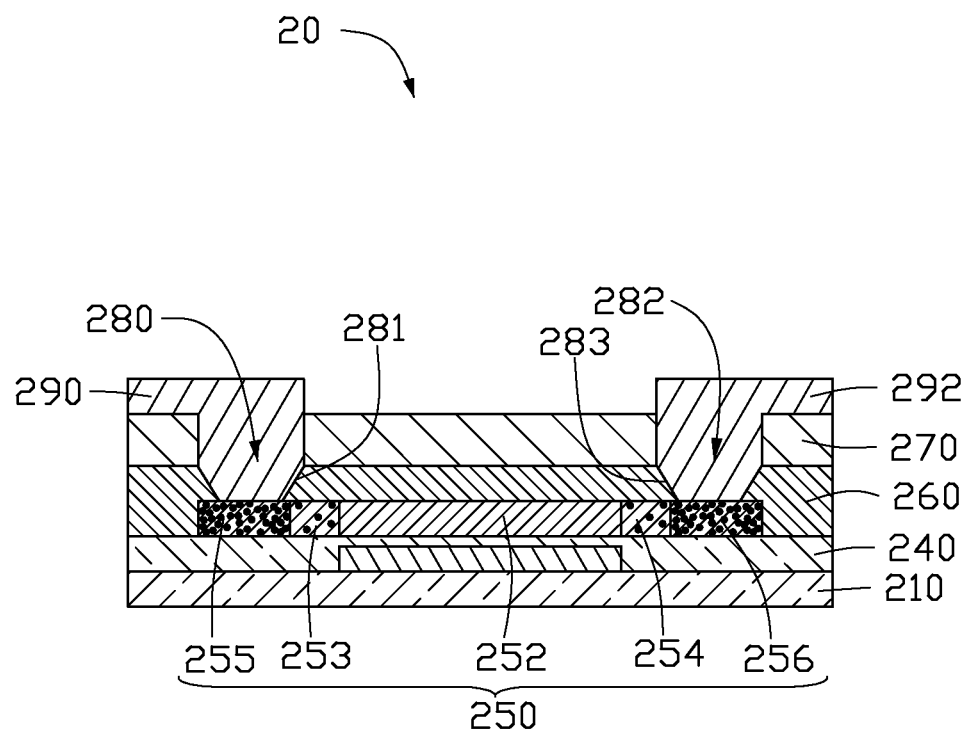
FIG. 17 illustrates the photoresist layer removed from the second ILD layer and a source and a drain are formed to couple with the semiconductive layer.
Figure 18:
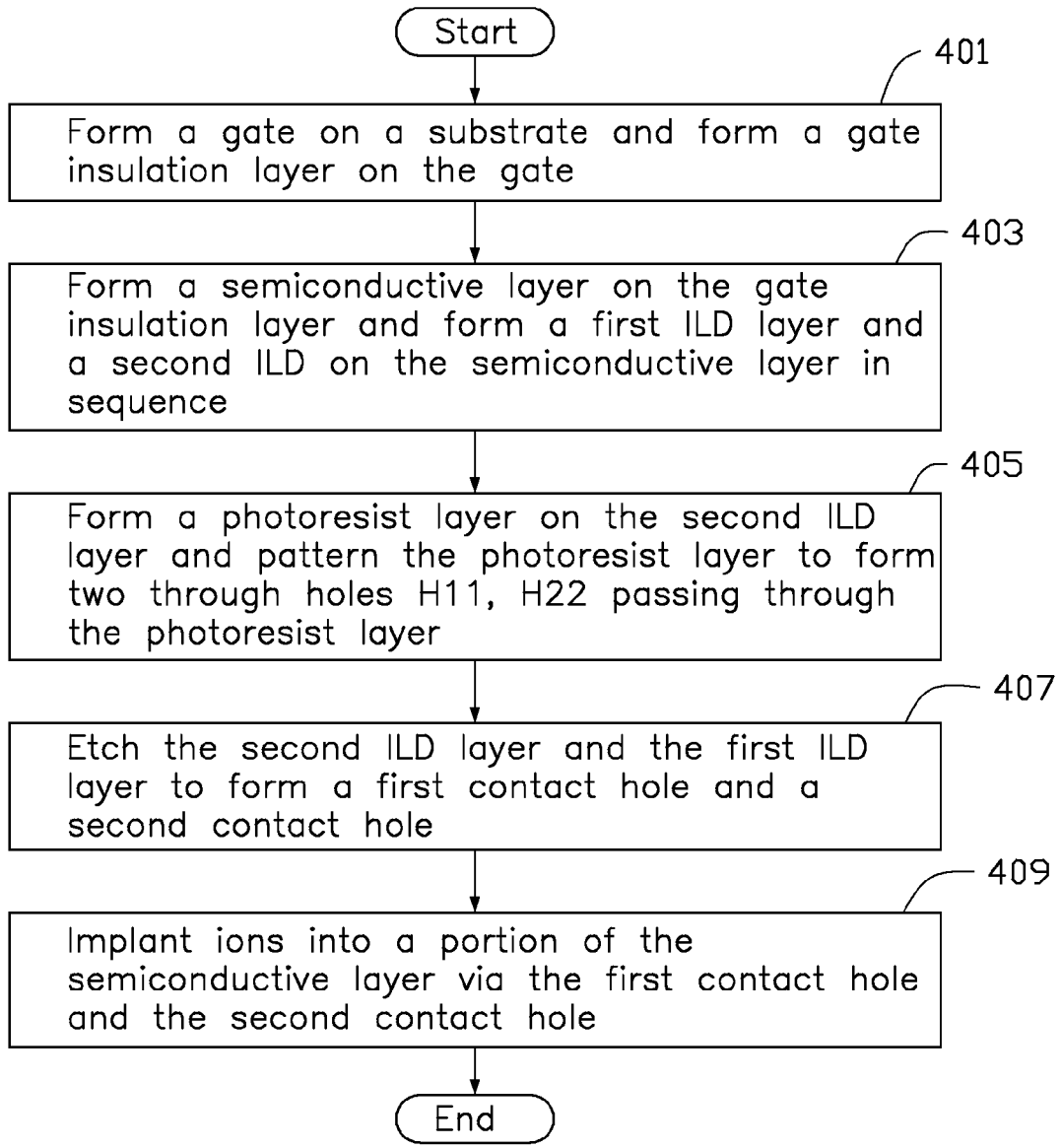
FIG. 18 is a flowchart of a method for manufacturing the TFT of FIG. 10.

Referring to FIG. 12 to FIG. 18, FIG. 18 to FIG. 17 respectively illustrate each process for manufacturing the TFT 20. FIG. 18 illustrates a flowchart of a method for manufacturing the TFT 20. The method is provided by way of example, as there are a variety of ways to carry out the method. Each block shown in FIG. 18 represents one or more processes, methods, or subroutines which are carried out in the example method. Furthermore, the order of blocks is illustrative only and the order of the blocks can change. Additional blocks can be added or fewer blocks may be utilized without departing from the scope of this disclosure. The example method can begin at block 401.

Figure 12:
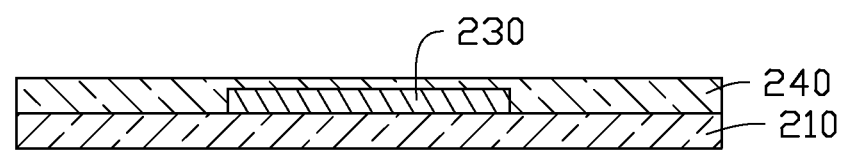
FIG. 12 illustrates a gate formed on a substrate in a manufacturing process of the TFT.

At block 401, referring to FIG. 12, a gate 230 is formed on a substrate 210 and a gate insulation layer 240 is formed on the gate 230 to cover the gate 230 and the substrate 210. In one embodiment, a first layer of conductive materials is coated on the substrate 210 and then the first layer of conductive materials is patterned to form the gate 230. When the gate 230 is formed on the substrate 210, a layer of insulation materials such as resin materials can be coated on the gate 230 and the substrate 210 to form the gate insulation layer 240.

Figure 13:
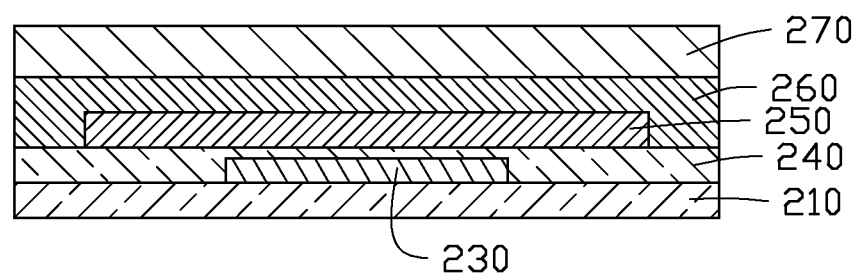
FIG. 13 illustrates a semiconductive layer formed on the gate insulation layer corresponding with the gate of FIG. 12, and a first ILD layer and a second ILD are formed on the semiconductive layer in sequence.

At block 403, referring to FIG. 13, a semiconductive layer 250 is formed on the gate insulation layer 240 to correspond with the gate 230, and a first ILD layer 260 and a second ILD 270 are sequentially formed on the semiconductive layer 250. In one example, a layer of amorphous silicon (a-Si) materials is first coated on the gate insulation layer 240. Then, the a-Si materials are annealed by an excimer laser annealing (ELA) to form the semiconductive layer 250. Finally, a first layer of dielectric materials is coated on the semiconductive layer 250 and the gate insulation layer 240 to form the first ILD layer 260 and a second layer of dielectric materials is coated on the first ILD layer 260 to form the second ILD layer 270.

Figure 14:
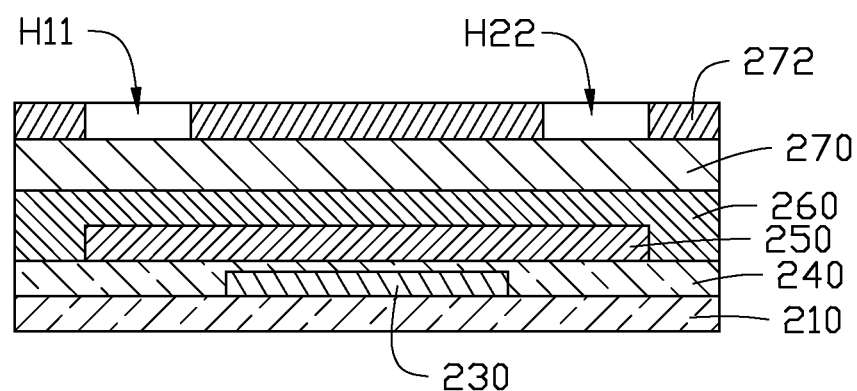
FIG. 14 illustrates a photoresist layer having two through holes formed on the second ILD layer of FIG. 13.

At block 405, referring to FIG. 14, a photoresist layer 272 is formed on the second ILD layer 270 and the photoresist layer 272 is patterned by a lithographic process to form two through holes H11, H22 passing through the photoresist layer 272.

Figure 15:
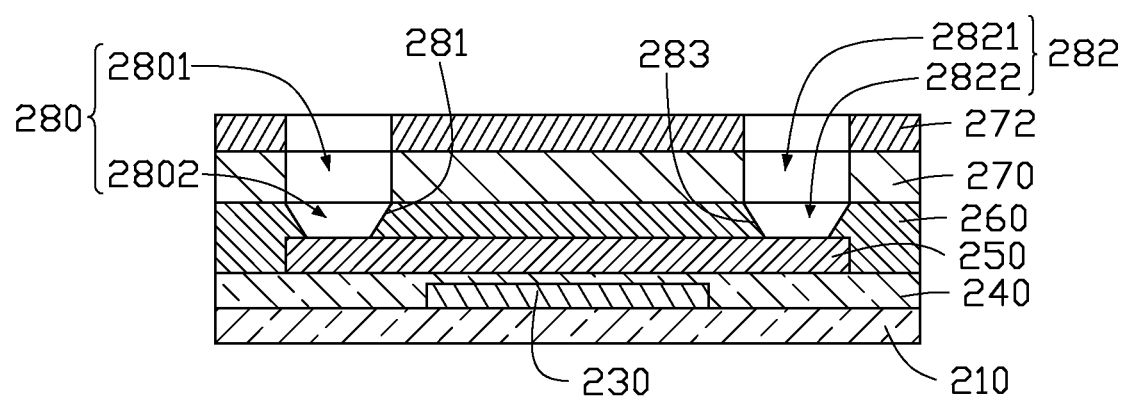
FIG. 15 illustrates a first contact hole and a second contact hole passing through the second ILD layer, the first ILD layer of FIG. 14 being formed by an etching process.

At block 407, referring to FIG. 15, the second ILD layer 270 and the first ILD layer 260 are etched in an etching process to respectively form a first contact hole 280 and a second contact hole 282 under the two through holes H11 and H22.

In at least one embodiment, the first contact hole 280 includes a first portion 2801 passing through the second IDL layer 270 and a second portion 2802 passing through the first IDL layer 260. The second contact hole 282 includes a first portion 2821 passing through he second IDL layer 270 and a second portion 2822 passing through the first IDL layer 260. The second portion 2802 of the first contact hole 280 is substantially trapezoidal and has two oppositely inclined sidewalls 281. The second portion 2822 of the second contact hole 282 is substantially trapezoidal and has oppositely inclined sidewalls 283. The first portion 2801 of the first contact hole 280 and the first portion 2821 of the second contact hole 282 are substantially rectangular. The first contact hole 280 and the second contact hole 282 can be formed using a plasma etching process, a reactive ion etching processing, or other like etching process.

At block 409, referring to FIG. 16, an ion implanting process is performed to implant ions into a portion of the semiconductive layer 250 via the first contact hole 280 and the second contact hole 282.

In this embodiment, when ions are implanted into the semiconductive layer 250, the semiconductive layer 250 includes a channel region 252, a first lightly doped drain (LDD) region 253, a second LDD region 254, a first heavily doped drain (HDD) region 255, and a second HDD region 256. The channel region 250 does not include implanted ions. The first LDD region 253 and the second LDD region 254 are respectively located at opposite sides of the channel region 132. The first HDD region 135 is located at a side of the first LDD region 253 away from the channel region 252, and the second HDD region 256 is located at a side of the second LDD region 254 away from the channel region 252. Each of the first LDD region 253 and the second LDD region 254 is an N⁻ doped region, and each of the first HDD region 255 and the second HDD region 256 is an N⁺ doped region, because the TFT 20 is an N-channel top gate type TFT. A doped concentration of the first LDD region 253 and the second LDD region 254 is in a range about from $10^{12}$ atom/cm² to $10^{14}$ atom/cm². A doped concentration of the first HDD region 255 and the second HDD region 256 is in a range about from $10^{14}$ atom/cm² to $10^{16}$ atom/cm². A projected area of the first portion 2801 of the first contact hole 280 projected on the substrate 210 is greater than an area of the first HDD region 255 but is less than a sum of the area of the first HDD region 255 and an area of the first LDD region 253. Accordingly, a projected area of the first portion 2821 of the second contact hole 282 projected on the substrate 210 is greater than an area of the second HDD region 256 but is less than a sum of the area of the second HDD region 256 and an area of the second LDD region 254.

At block 411, referring to FIG. 17, the photoresist layer 272 is removed from the second ILD layer 270 and a source 290 and a drain 292 are formed to couple with the semiconductive layer 250. In this embodiment, the source 290 and the drain 292 can be formed by conductive materials which are filled into the first contact hole 280 and the second contact hole 282.

As described above, the LDD regions and the HDD regions of the TFT can be formed in a single ion implanting process. Thus, the cost for manufacturing the TFT can be reduced.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A thin film transistor (TFT) comprising:
a substrate;
a semiconductive layer on the substrate and comprising a channel region, a first lightly doped drain (LDD) region and a second LDD region respectively located at opposite sides of the channel region, a first heavily doped drain (HDD) region located at a side of the first LDD region away from the channel region, and a second HDD region located at a side of the second LDD region away from the channel region;
a first inter-layer drain (ILD) layer on the semiconductive layer;
a second ILD layer on the first ILD layer; and
at least one contact hole passing extending through the first ILD layer and the second ILD layer, each of the at least one contact hole comprising a first portion extending through the second ILD layer and a second portion extending through the first ILD layer, wherein the second portion gradually narrows along a direction from a top surface to a bottom surface of the first ILD layer; a cross section of the first portion is rectangular, and a cross section of the second portion is trapezoidal; the first portion has a same width along a direction from a top surface to a bottom surface of the second ILD layer; a projected area of the first portion projected on the substrate is greater than an area of the first HDD region.

2. The TFT according to claim 1, wherein the at least one contact hole comprises a first contact hole and a second contact hole, and a source and a drain of the TFT are respectively coupled to the semiconductive layer by the first contact hole and the second contact hole.

3. The TFT according to claim 1, wherein a projected area of the first portion projected on the substrate is less than a sum of the area of the first HDD region and an area of the first LDD region.

4. The TFT according to claim 1, wherein a projected area of the first portion projected on the substrate is greater than an area of the second HDD region but less than a sum of the area of the second HDD region and an area of the second LDD region.

5. The TFT according to claim 1, further comprising a gate and a gate insulation layer, the gate insulation layer is located on the semiconductive layer, the gate is located on the gate insulation layer and covered by the first ILD layer, wherein the second portion of the at least one contact hole extends through the gate insulation layer.

6. The TFT according to claim 1, wherein an etching rate of the first ILD layer is different from an etching rate of the second ILD layer.

7. The TFT according to claim 1, wherein a doped concentration of the first LDD region and the second LDD region is from $10^{12}$ atom/cm² to $10^{14}$ atom/cm², and a doped concentration of the first HDD region and the second HDD region is from $10^{14}$ atom/cm² to $10^{16}$ atom/cm².

8. The TFT according to claim 1, wherein each of the first LDD region and the second LDD region is an N⁻ doped region, and each of the first HDD region and the second HDD region is an N⁺ doped region.

9. The TFT according to claim 1, wherein the first LDD region, the second LDD region, the first HDD region, and the second HDD region are formed in a single ion implanting process.

10. A method for manufacturing a thin film transistor (TFT) comprising:
forming a semiconductive layer on a substrate;
forming a first inter-layer dielectric (ILD) layer and a second ILD layer on the semiconductive layer, the first ILD layer located on the semiconductive layer, the second ILD layer covering the first ILD layer;
forming at least one contact hole extending through the first ILD layer and the second ILD layer by etching the first ILD layer and the second ILD layer, the at least one contact hole comprising a first portion extending through the second ILD layer and a second portion extending through the first ILD layer, wherein the second portion gradually narrows along a direction from a top surface to a bottom surface of the first ILD layer; a cross section of the first portion is rectangular, and a cross section of the second portion is trapezoidal; the first portion has a same width along a direction from a top surface to a bottom surface of the second ILD layer; and
performing an ion implanting process to implant ions into a portion of the semiconductive layer by the first contact hole and the second contact hole, to form at least one lightly doped drain (LDD) region and at least one heavily doped drain (HDD) region in the semiconductive layer; wherein a projected area of the first portion projected on the substrate is greater than an area of one of the at least one HDD region.

11. The method according to claim 10, wherein before forming at least one contact hole,
forming a photoresist layer having at least one through hole on the second ILD layer.

12. The method according to claim 10, wherein before forming the first ILD layer and the second ILD layer on the semiconductive layer,
forming a gate insulation layer on the semiconductive layer and forming a gate on the gate insulation layer, wherein the gate is located between the first ILD layer and the gate insulation layer.

13. The method according to claim 12, wherein forming at least one contact hole further comprises:
etching the gate insulation layer to allow the second portion of the at least one contact hole to extend through the gate insulation layer.

14. The method according to claim 10, wherein the at least one contact hole comprises a first contact hole and a second contact hole, the method further comprises:
filling conductive materials into the first contact hole and the second contact hole to form a source and a drain respectively coupled to the semiconductive layer.

15. The method according to claim 10, wherein the first ILD layer and the second ILD layer are made of different materials having different etching rates.

16. The method according to claim 15, wherein the first ILD layer is made of oxide materials, and the second ILD layer is made of nitride materials.

17. The method according to claim 10, wherein a projected area of the first portion projected on the substrate is less than a sum of an area of one of the at least one HDD region and an area of one of the at least one LDD region.

* * * * *